United States Patent
Chang et al.

(10) Patent No.: US 8,835,948 B2
(45) Date of Patent: Sep. 16, 2014

(54) STACKED LED DEVICE WITH DIAGONAL BONDING PADS

(75) Inventors: Yuan-Hsiao Chang, Taipei (TW); Yi-An Lu, Chiayi (TW)

(73) Assignee: Phostek, Inc., Grand Cayman (KY)

( * ) Notice: Subject to any disclaimer, the term of this patent is extended or adjusted under 35 U.S.C. 154(b) by 287 days.

(21) Appl. No.: 13/450,682

(22) Filed: Apr. 19, 2012

(65) Prior Publication Data

US 2013/0277692 A1    Oct. 24, 2013

(51) Int. Cl.
*H01L 29/201* (2006.01)
*H01L 33/00* (2010.01)

(52) U.S. Cl.
USPC ................... 257/90; 257/91; 438/28

(58) Field of Classification Search
USPC ........... 257/90, 91, 96, 98; 438/26, 28
See application file for complete search history.

(56) References Cited

U.S. PATENT DOCUMENTS

| | | | |
|---|---|---|---|
| 5,739,552 A | 4/1998 | Kimura et al. | |
| 5,757,026 A | 5/1998 | Forrest et al. | |
| 6,100,103 A * | 8/2000 | Shim et al. | 438/26 |
| 6,642,545 B2 | 11/2003 | Okazaki | |
| 7,064,354 B2 | 6/2006 | Chen | |
| 7,732,803 B2 | 6/2010 | Shum et al. | |
| 2005/0146270 A1 | 7/2005 | Ho | |
| 2007/0137698 A1* | 6/2007 | Wanlass et al. | 136/261 |
| 2008/0251799 A1 | 10/2008 | Ikezawa | |
| 2008/0277686 A1* | 11/2008 | Tsai | 257/103 |
| 2010/0109028 A1 | 5/2010 | Chen et al. | |

* cited by examiner

*Primary Examiner* — Errol Fernandes
(74) *Attorney, Agent, or Firm* — Huffman Law Group, PC

(57) ABSTRACT

A semiconductor light emitting device includes a substrate and a first epitaxial structure over the substrate. The first epitaxial structure includes a first doped layer, a first light emitting layer, and a second doped layer. A first electrode is coupled to the first doped layer. A second electrode is coupled to the second doped layer facing the same direction as the first electrode. A second epitaxial structure includes a third doped layer, a second light emitting layer, and a fourth doped layer. A third electrode is coupled to the third doped layer facing the same direction as the first electrode. A fourth electrode is coupled to the fourth doped layer facing the same direction as the first electrode. An adhesive layer is between the first epitaxial structure and the second epitaxial structure.

13 Claims, 5 Drawing Sheets

STACKED LED DEVICE WITH DIAGONAL BONDING PADS

BACKGROUND

1. Field of the Invention

The present invention relates to a semiconductor light emitting component, and more particularly to a light emitting diode (LED) module and a method for manufacturing the LED module.

2. Description of Related Art

U.S. Pat. No. 7,575,340 to Kung et al. ("Kung '340"), which is incorporated by reference as if fully set forth herein, describes conventional light projectors using gas discharge lamps as the optical engine of the projectors along with their deficiencies and how light source systems using light-emitting diode (LED) modules as the optical engine can overcome some of the problems. Conventional projectors (optical systems) that use gas discharge lamp light sources may be expensive and have short service lives. Gas discharge lamp light sources may also emit ultraviolet light, which requires isolation of the gas discharge lamp to inhibit damage due to the ultraviolet light. Gas discharge lamps are also not typically thought of as being environmentally friendly or a "green product" because of the energy usage of the lamps and the use of mercury in the lamps.

To overcome the problems with gas discharge lamps, Kung '340 describes light source system 10 using three LED modules 12, 14, 16 as the optical engine, shown in FIG. 1. The light source system of Kung '340, however, uses three separate, stand-alone sets of LED modules (e.g., one set each of red, blue, and green LED modules). The light from the three separate sets of LED modules is combined to provide the resultant light emitted from the light source system (e.g., light projector system). The use of multiple sets of LED modules and corresponding components (e.g., a diode lens cap and a primary lens unit) may, however, be bulky and more expensive. Thus, there is a need to reduce the size of the optical engine and potentially lower the cost for producing the light source system.

SUMMARY

In certain embodiments, a semiconductor light emitting device includes a substrate with a first epitaxial structure over the substrate. The first epitaxial structure includes a first doped layer, a first light emitting layer, and a second doped layer. A first electrode is coupled to the first doped layer. A second electrode is coupled to the second doped layer that faces the same direction as the first electrode. A second epitaxial structure includes a third doped layer, a second light emitting layer, and a fourth doped layer. A third electrode is coupled to the third doped layer that faces the same direction as the first electrode. A fourth electrode is coupled to the fourth doped layer that faces the same direction as the first electrode. An adhesive layer between the first epitaxial structure and the second epitaxial structure.

In certain embodiments, a method for forming a semiconductor light emitting device includes providing a first epitaxial structure over a substrate. The first epitaxial structure includes a first doped layer, a first light emitting layer, and a second doped layer. A second epitaxial structure is then provided. The second epitaxial structure includes a third doped layer, a second light emitting layer, and a fourth doped layer. The second epitaxial structure is bonded to a second temporary substrate. The first temporary substrate is removed from the second epitaxial structure. The first epitaxial structure is bonded to the second epitaxial structure using an adhesive layer. The second temporary substrate is removed from the second epitaxial structure.

In certain embodiments, a light emitting diode array includes two or more light emitting diode modules formed on a substrate. Each light emitting diode module may include a first epitaxial structure over the substrate. The first epitaxial structure includes a first doped layer, a first light emitting layer, and a second doped layer. A first electrode is coupled to the first doped layer. A second electrode is coupled to the second doped layer that faces the same direction as the first electrode. A second epitaxial structure includes a third doped layer, a second light emitting layer, and a fourth doped layer. A third electrode is coupled to the third doped layer that faces the same direction as the first electrode. An adhesive layer is between the first epitaxial structure and the second epitaxial structure. One of the first electrode and the second electrode of one light emitting diode module is coupled to one of the first electrode and the second electrode of an adjacent light emitting module; and one of the third electrode and the fourth electrode of one light emitting diode module is coupled to one of the third electrode and the fourth electrode of an adjacent light emitting module.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
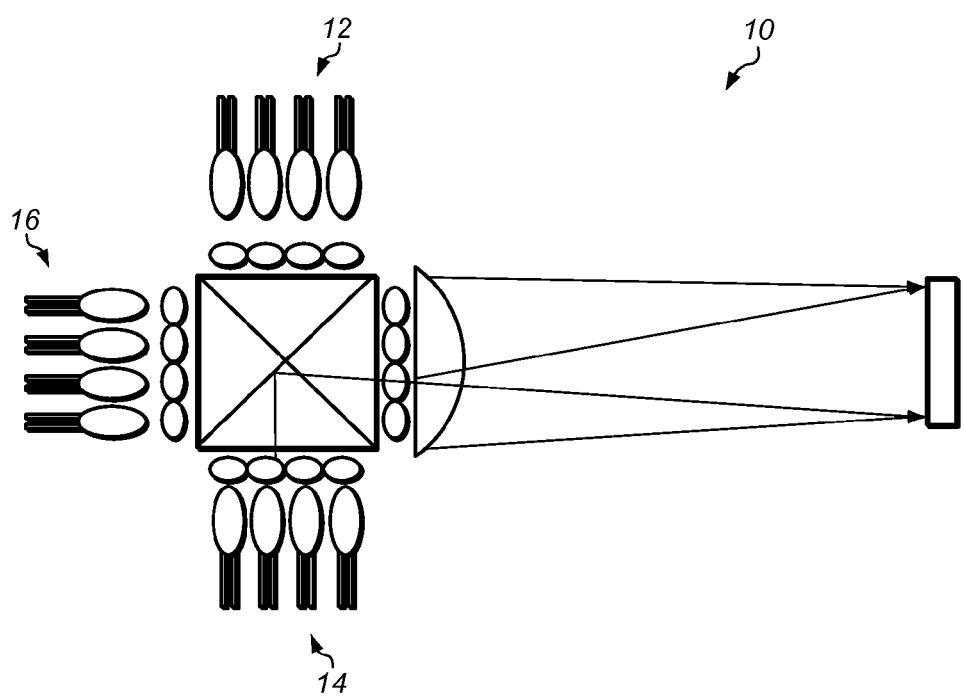
FIG. 1 depicts a prior art light source system using three LED modules as an optical engine.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In the context of this patent, the term "coupled" means either a direct connection or an indirect connection (e.g., one or more intervening connections) between one or more objects or components.

Figure 2:
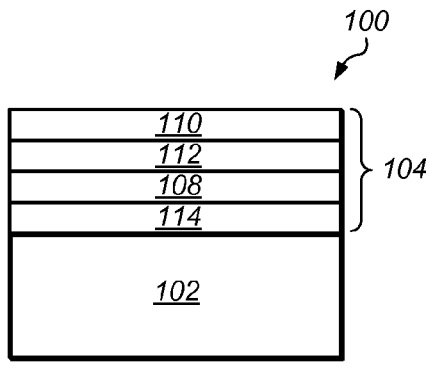
FIG. 2 depicts a side-view representation of an embodiment of a horizontal light emitting diode (LED).

FIG. 2 depicts a side-view representation of an embodiment of horizontal light emitting diode (LED) 100. LED 100 includes epitaxial structure 104 on substrate 102. In certain embodiments, epitaxial structure 104 is grown from substrate 102 by a thin film deposition process (e.g., an epitaxial growth process). In certain embodiments, substrate 102 includes sapphire, germanium (Ge), silicon carbide (SiC), gallium arsenide (GaAs), zinc oxide (ZnO), or lithium aluminum oxide ($\gamma$-LiAlO$_2$). In some embodiments, substrate 102 is polar substrate, semi-polar substrate, or non-polar substrate. Epitaxial growth of group-III nitride (e.g., GaN, InGaN, AlGaN, AlInGaN) can be achieved on substrate 102. In some embodiments, substrate 102 is a patterned substrate (e.g., a patterned sapphire substrate). In some embodiments, substrate 102 includes a reflective layer on the upper surface of the substrate. The reflective layer may include a distributed Bragg reflector (DBR), an omni-directional reflector (ODR), silver, aluminum, titanium, and/or other reflective metals.

In certain embodiments, during the epitaxy growth process, group-III nitride material is epitaxially grown up from substrate 102 to form n-type doped layer 108 and p-type doped layer 110. In some embodiments, epitaxial structure 104 includes undoped layer 114 between substrate and n-type doped layer 108.

In some embodiments, a conducting layer is formed on top of p-doped layer 110. The conducting layer may be formed on top of p-doped layer 110 using, for example, a deposition process. In certain embodiments, the conducting layer is a substantially transparent conducting layer. The conducting layer may include, for example, indium tin oxide (ITO). In certain embodiments, the conducting layer provides current spreading for p-doped layer 110.

When electrical energy is applied to epitaxial structure 104, light emitting portion 112 at junction of n-type doped layer 108 and p-type doped layer 110 generates an electron-hole capture phenomenon. As a result, the electrons of light emitting portion 112 will fall to a lower energy level and release energy with a photon mode. In certain embodiments, light emitting portion 112 is a single quantum well (SQW) or a multiple quantum well (MQW) structure capable of restricting a spatial movement of the electrons and the holes. Thus, a collision probability of the electrons and the holes is increased so that the electron-hole capture phenomenon occurs easily, thereby enhancing light emitting efficiency.

When a voltage is applied between n-type doped layer 108 and p-type doped layer 110, an electric current flows between electrodes coupled to the n-type doped layer and the p-type doped layer through epitaxial substrate 102 and is horizontally distributed in epitaxial structure 104. Thus, a number of photons are generated by a photoelectric effect in epitaxial structure 104. LED 100 emits light from epitaxial structure 104 due to the horizontally distributed electric current.

Figure 3:
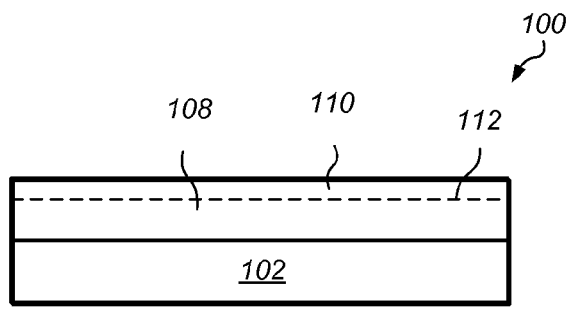
FIG. 3 depicts a simplified side-view representation of the embodiment of an LED showing a substrate, an n-doped layer, a p-doped layer, and a light emitting layer.

FIG. 3 depicts a simplified side-view representation of the embodiment of LED 100 showing substrate 102, n-doped layer 108, p-doped layer 110, and light emitting layer 112. In certain embodiments, LED 100 is a horizontal LED. For example, light emitting layer 112 may be formed to emit blue light, green light, or red light.

Figure 4:
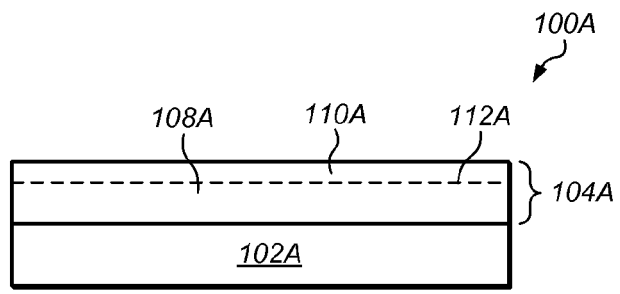
FIG. 4 depicts a side-view representation of an embodiment of a bottom LED to be used in the stacked LED module.

In certain embodiments described herein, two LEDs 100 may be combined (e.g., stacked) to form an LED module emitting light beams with the same wavelengths. In certain embodiments described herein, two LEDs 100 may be combined (e.g., stacked) to form an LED module emitting two separate light beams with different wavelengths. For example, a green light emitting LED may be stacked with a blue light emitting LED in a single LED module such that the LED emits the green light beam separately from the blue light beam. FIGS. 4-10 depict various steps in an embodiment of a process for forming a stacked LED module with two LEDs 100. FIG. 4 depicts a side-view representation of an embodiment of bottom LED 100A to be used in the stacked LED module. In certain embodiments, bottom LED 100A includes substrate 102A and epitaxial structure 104A. Epitaxial structure 104A includes n-doped layer 108A, p-doped layer 110A, and light emitting layer 112A. Substrate 102A may be a sapphire substrate and light emitting layer 112A may be a green light emitting layer. Thus, in certain embodiments, bottom LED 100A is a green light emitting LED. In some embodiments, substrate 102A includes a reflective layer on the upper surface of the substrate. The reflective layer may include a distributed Bragg reflector (DBR), an omni-directional reflector (ODR), silver, aluminum, titanium, and/or other reflective metals.

Figure 5:
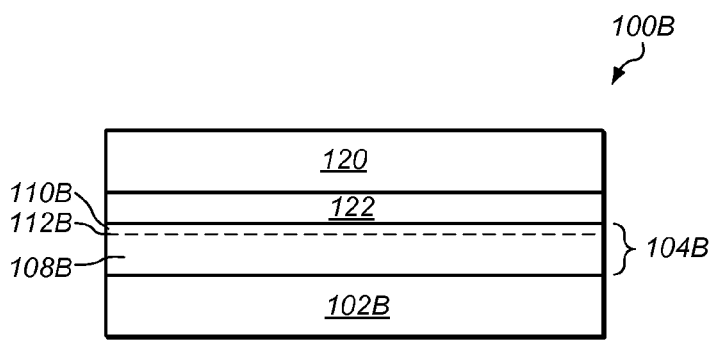
FIG. 5 depicts a side-view representation of an embodiment of a top LED to be used in the stacked LED module.

In certain embodiments, to form the LED module, the top surface of the top LED may be bonded to a temporary substrate. FIG. 5 depicts a side-view representation of an embodiment of top LED 100B to be used in the stacked LED module. In certain embodiments, top LED 100B includes substrate 102B and epitaxial structure 104B. Epitaxial structure 104B includes n-doped layer 108B, p-doped layer 110B, and light emitting layer 112B. Substrate 102B may be a sapphire substrate and light emitting layer 112B may be a blue light emitting layer. Thus, in certain embodiments, top LED 100B is a blue light emitting LED.

In certain embodiments, the top surface (the surface opposite substrate 102B) of top LED 100B is coupled (e.g., bonded) to temporary substrate 120 with adhesive layer 122. Temporary substrate 120 may be a glass or ceramic substrate. Adhesive layer 122 may include materials such as, but not limited to, epoxy glue, wax, SOG (spin-on-glass), photoresist, monomer, polymer (e.g., polyimide), benzocyclobutene (BCB), or any glue type material known in the art for bonding GaN layers to ceramic or glass layers.

Figure 6:
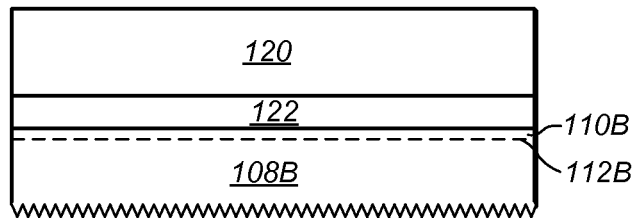
FIG. 6 depicts a side-view representation of an embodiment of the top LED with the substrate removed from the bottom of the top LED to expose the bottom surface of the top LED.

Following bonding of top LED 100B to temporary substrate 120, substrate 102B is removed from the bottom of the top LED to expose the bottom surface of the top LED, as shown in FIG. 6. Substrate 102B may be removed using, for example, a laser lift-off (LLO) process. Removing substrate 102B exposed the bottom surface of n-doped layer 108B. In some embodiments, if there is an undoped layer between substrate 102B and n-doped layer 108B (e.g., undoped layer 114 depicted in FIG. 2), undoped layer 114 is exposed instead of n-doped layer 108B. In some embodiments, the exposed bottom surface of n-doped layer 108B or undoped layer 114 is roughened, as shown in FIG. 6. For example, the bottom surface may be roughened using a wet etching process.

Figure 7:
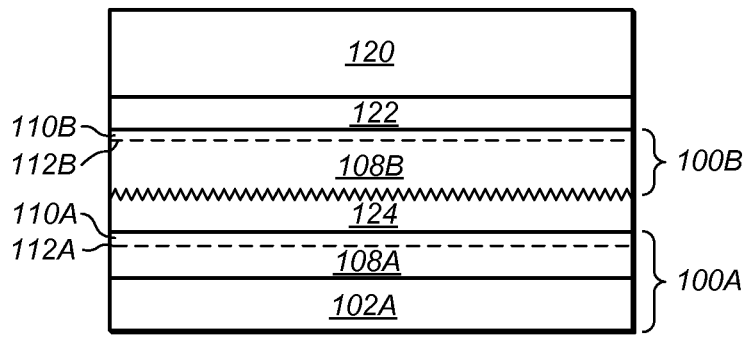
FIG. 7 depicts a side-view representation of an embodiment with the top LED bonded to the bottom LED.

Following removal of substrate 102B, top LED 100B is bonded to bottom LED 100A, as shown in FIG. 7. To bond top LED 100B to bottom LED 100A, the exposed bottom surface of n-doped layer 108B or undoped layer 114 may be bonded to the upper surface of p-doped layer 110A (or a conducting layer (e.g., an ITO layer) formed on top of the p-doped layer)

of bottom LED 100A (e.g., the top surface of the bottom LED opposite substrate 102A). In certain embodiments, top LED 100B is bonded to bottom LED 100A with adhesive layer 124. In certain embodiments, adhesive layer 124 is a glue material with a low refractive index (e.g., refractive index of about 1.5). For example, adhesive layer 124 may include materials such as, but not limited to, SOG (spin-on-glass), photoresist, polymer (e.g., polyimide), or benzocyclobutene (BCB). Using adhesive layer 124 to bond top LED 100B to bottom LED 100A allows the LEDs to be bonded without the use of a substrate between the LEDs. Having no substrate between the LEDs improves light extraction from the stacked LED module.

In certain embodiments, the top surface of bottom LED 100A is flat or roughened. In some embodiments, the bottom surface of top LED 100B is flat or roughened.

In some embodiments, both the top surface of bottom LED 100A and the bottom surface of top LED 100B are flat. In such embodiments, substrate 102A of bottom LED 100A may be a patterned substrate and/or the bottom surface of n-doped layer 108A or undoped layer 114 may be patterned. Patterning substrate 102A and/or the patterned bottom surface of n-doped layer 108A or undoped layer 114 may increase light extraction from the stacked LED module.

Figure 8:
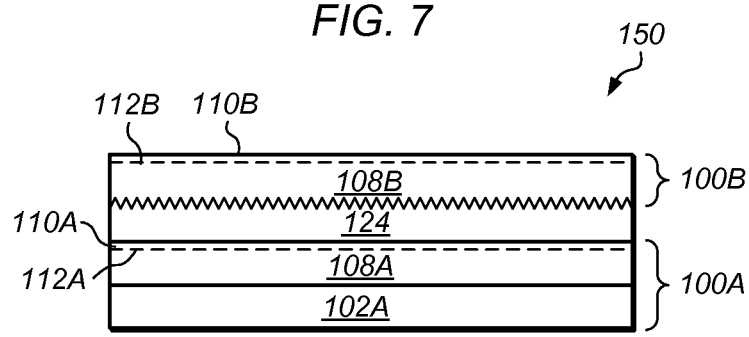
FIG. 8 depicts a side-view representation of an embodiment with a temporary substrate and an adhesive layer removed from the top LED to form the stacked LED module.

Following bonding of top LED 100B to bottom LED 100A, temporary substrate 120 and adhesive layer 122 may be removed from the top LED to form stacked LED module 150, as shown in FIG. 8. Temporary substrate 120 and adhesive layer 122 may be removed using, for example, a LLO process, an acid etching process, or another suitable etching process.

Figure 9:
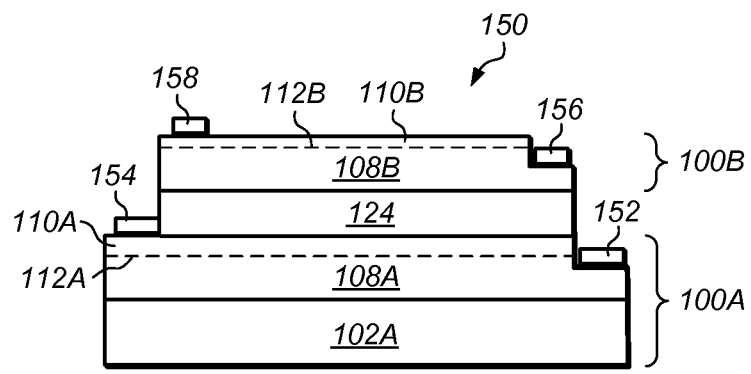
FIG. 9 depicts a side-view representation of an embodiment with electrodes formed on the stacked LED module.

Following removal of temporary substrate 120 and adhesive layer 122, electrodes 152, 154, 156, 158 are formed on stacked LED module 150, as shown in FIG. 9. Electrodes 152, 154, 156, 158 may be, for example, bonding pads for connection to doped layers in stacked LED module 150. Electrodes 152, 154, 156, 158 may be formed using one or more etch processes (e.g., inductively coupled plasma (ICP) etches) followed by one or more electrode material (e.g., metal) deposition steps. For example, one or more etching processes may be used to remove portions of layers in top LED 100B and bottom LED 100A to form pads for contacting the electrodes to p-doped layers 110A, 110B and n-doped layers 108A, 108B. Following the etching process(es), electrode material may be formed (deposited) on the pads such that electrodes 152, 154, 156, 158 are in ohmic contact with their respective underlying layers. For example, electrode 152 is in ohmic contact with n-doped layer 108A, electrode 154 is in ohmic contact with p-doped layer 110A, electrode 156 is in ohmic contact with n-doped layer 108B, and electrode 158 is in ohmic contact with p-doped layer 110B. In certain embodiments, electrodes 152, 154 provide electrical energy to bottom LED 100A and electrodes 156, 158 provide electrical energy to top LED 100B.

In certain embodiments, electrodes 152, 154, 156, 158 are formed such that the electrodes face the same direction, as shown in FIG. 9. For example, the top surfaces of electrodes 152, 154, 156, 158 may face away from substrate 102A (e.g., the contact surfaces of the electrodes are on the upper surface of stacked LED module 150). With the top (exposed) surfaces of electrodes 152, 154, 156, 158 facing away from substrate 102A, connections (e.g., bonds) may be made to the electrodes from the same side (e.g., the upper side) of stacked LED module 150. Making connections to electrodes 152, 154, 156, 158 on the upper surface of stacked LED module 150 may reduce the size of an optical device derived from the stacked LED module.

Figure 10:
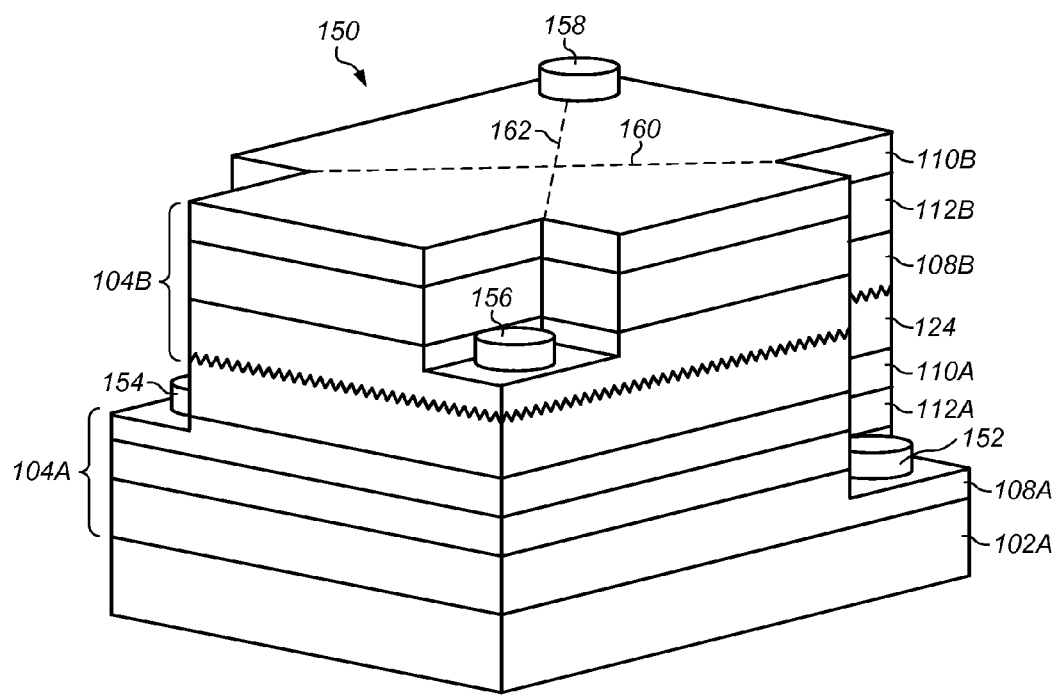
FIG. 10 depicts a perspective view of an embodiment of the stacked LED module with each electrode located at or near one of the corners of the stacked LED module.

In certain embodiments, electrodes 152, 154 are physically and electrically isolated from electrodes 156, 158 to allow for independent control of bottom LED 100A and top LED 100B. For example, each electrode 152, 154, 156, 158 may be located in one of the four corners of stacked LED module 150. FIG. 10 depicts a perspective view of an embodiment of stacked LED module 150 with each electrode 152, 154, 156, 158 located at or near one of the corners of the stacked LED module.

As shown in FIG. 10, electrode 152 may be located at or near a first corner of bottom LED 100A and electrode 154 may be located at or near a second corner of the bottom LED that is opposite the first corner. Electrodes 156, 158 may be located at or near opposite third and fourth corners, respectively, of top LED 100B. Thus, electrodes 152, 154 are located at or near opposite corners along diagonal 160 of bottom LED 100A while electrodes 156, 158 are located at or near opposite corners along diagonal 162 of top LED 100B. As shown in FIG. 10, diagonal 160 crosses diagonal 162. The angle between diagonal 160 and diagonal 162 may vary based on, for example, the shape of bottom LED 100A and/or the shape of top LED 100B. For example, if bottom LED 100A and top LED 100B are square shaped LEDs, diagonal 160 may cross diagonal 162 at a substantially perpendicular (e.g., about 90°) angle. If bottom LED 100a and top LED 100B are, however, rectangular in shape, the angle between diagonal 160 and diagonal 162 will be an angle other than 90°.

Locating the electrodes for each of bottom LED 100A and top LED 100B on separate diagonals that cross each other allows for independent control of the epitaxial structures of the bottom and top LEDs. For example, epitaxial structure 104A of bottom LED 100A may be biased independently from epitaxial structure 104B of top LED 100B. Independent biasing of epitaxial structure 104A and epitaxial structure 104B provides independent control of light emitting layers 112A, 112B. Thus, in certain embodiments, light emitting layer 112A and light emitting layer 112B emit different wavelengths of light that are independently controllable. In certain embodiments, light emitting layer 112A emits light with a longer wavelength than light emitted from light emitting layer 112B. For example, light emitting layer 112A may emit green light and be independently controlled from light emitting layer 112B that emits blue light.

Because bottom LED 100A and top LED 100B can be controlled independently, stacked LED module 150 can emit light in a range of wavelengths between the wavelength emitted by the bottom LED and the wavelength emitted by the top LED. For example, at any point during use, stacked LED module 150 may emit light at the wavelength of bottom LED 100A, the wavelength of top LED 100B, or a combination of the wavelengths of the bottom LED and the top LED depending on the biases applied to the bottom LED and the top LED.

While FIGS. 4-10 depict various steps in the embodiment of the process for forming stacked LED module 150 with two LEDs 100A, 100B, it is to be understood that one or more of the steps depicted and described herein may be used in a process to form multiple stacked LED modules on a single substrate or multiple substrates. For example, the steps depicted and described herein may be used in a wafer-to-wafer bonding process with multiple bottom LEDs formed on a first wafer bonded to multiple top LEDs formed on a second, temporary wafer.

Figure 11:
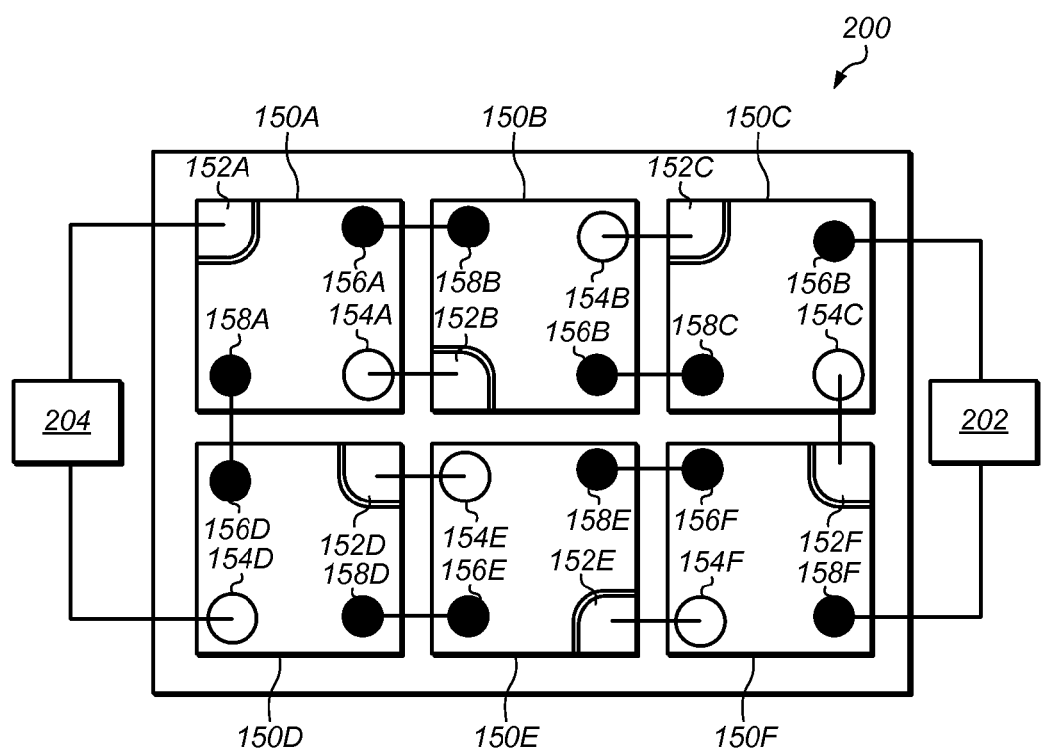
FIG. 11 depicts an embodiment of an LED array with six stacked LED modules in a 3×2 array.

In certain embodiments, two or more stacked LED modules 150 are interconnected in an LED array. For example, a plurality of stacked LED modules may be arranged in an m×n LED array where m is an odd number and n is an even number. FIG. 11 depicts an embodiment of LED array 200 with six stacked LED modules 150A-F in a 3×2 array. In LED array 200, electrodes 156, 158 of top LEDs are interconnected and electrodes 152, 154 of bottom LEDs are interconnected. The electrodes may be interconnected to electrically couple n-doped layers and p-doped layers of adjacent LEDs. The top LEDs may be interconnected separately from the bottom LEDs to provide independent control of the top LEDs from the bottom LEDs. For example, the electrodes 156, 158 of the top LEDs may be interconnected and coupled to first power supply 202 and electrodes 152, 154 of the bottom LEDs may be interconnected and coupled to second power supply 204.

In certain embodiments, an electrode in ohmic contact with the n-doped layer of a bottom LED (e.g., electrode 152B of stacked LED module 150B) is interconnected with an electrode in ohmic contact with the p-doped layer of an adjacent LED. For example, as shown in FIG. 11, electrode 152B of stacked LED module 150B is interconnected with electrode 154A of stacked LED module 150A. Similarly, an electrode in ohmic contact with the n-doped layer of a top LED (e.g., electrode 156A of stacked LED module 150A) is interconnected with an electrode in ohmic contact with the p-doped layer of an adjacent LED. For example, as shown in FIG. 11, electrode 156A of stacked LED module 150A is interconnected with electrode 158B of stacked LED module 150B.

As shown in FIG. 11, adjacent LEDs may be rotated with respect to each other to position interconnected electrodes as close together as possible and simplify the interconnection pattern. The interlaced pattern of LEDs and electrodes in LED array 200 allows power to be provided to each of the different wavelength LEDs from a single power supply on either side of the LED array (e.g., power supply 202 and power supply 204). Connecting an array of LEDs to only one power supply for each type of LED in the array (as shown in FIG. 11) reduces the size of the LED array and potentially lowers the cost for making and operating the LED array.

In some embodiments, stacked LED modules 150 that emit both green and blue light (e.g., bottom LED 100A emits green light and top LED 100B emits blue light) are placed in an LED package. For example, one or more stacked LED modules 150 may be placed on a board or lead frame in the LED package or LED array 200 with stacked LED modules 150 may be placed on the board or lead frame in the LED package.

In certain embodiments, a wavelength-conversion layer is located in the LED package. The wavelength-conversion layer may be distributed around one or more stacked LED modules 150 or LED array 200 inside the LED package. The combination of one or more stacked LED modules 150 and wavelength-conversion layer may produce (emit) approximately white light from the LED package. For example, green and blue light emitting stacked LED modules may be combined with a red/orange wavelength-conversion layer to emit approximately white light from the LED package.

The wavelength-conversion layer may include semiconductor materials. In some embodiments, the wavelength-conversion layer may include phosphor particles with different types of distribution in the LED package. In some embodiments, the wavelength-conversion layer includes phosphor particles uniformly distributed in a transparent encapsulating layer surrounding one or more stacked LED modules 150 in the LED package. In some embodiments, the wavelength-conversion layer includes phosphor particles conformally distributed (coated) on one or more of stacked LED modules 150. The coated stacked LED modules may then be encapsulated in the transparent encapsulating layer.

In some embodiments, the wavelength-conversion layer is formed (e.g., coated) over the transparent encapsulating layer such that the phosphor particles are remotely distributed from stacked LED modules 150. In some embodiments, an air gap is positioned between the transparent encapsulating layer and the wavelength-conversion layer. In some embodiments, a cap is formed over the wavelength-conversion layer or under the wavelength-conversion layer. The cap may be, for example, silicone, glass, epoxy, polycarbonate, acrylic, or other transparent material. In some embodiments, the wavelength-conversion layer is combined with the cap and remotely positioned over stacked LED modules 150. For example, the phosphor particles may be mixed with the material used to form the cap.

In some embodiments, stacked LED modules 150 that emit both green and blue light (e.g., bottom LED 100A emits green light and top LED 100B emits blue light) are combined with LED modules that emit red/orange light in a single LED array. For example, in LED array 200 shown in FIG. 11, stacked LED modules 150A, 150C, and 150E may remain LED modules that emit both green and blue light while stacked LED modules 150B, 150D, and 150F are replaced with LED modules that emit red/orange light. In some embodiments, the LED modules that emit red/orange light are stacked LED modules with both light emitting layers emitting the same wavelength light (e.g., red/orange light). Power in such an LED array may still be supplied using two power supplies (e.g., power supply 202 and power supply 204) with power from an individual power supply shared between green or blue emitting LEDs and red/orange emitting LEDs. Thus, the LED array with stacked LED modules that emit both green and blue light and stacked LED modules that emit red/orange light can be powered with two power supplies (e.g., DC power supplies) and the light from the stacked LED modules is combined to provide light output from the LED array at a single wavelength (e.g., white light).

In some embodiments, stacked LED modules 150 and LED array 200 are formed to emit light at a single wavelength. For example, in some embodiments, bottom LEDs 100A and top LEDs 100B emit light with the same wavelength to provide high voltage stacked LED modules. Such high voltage stacked LED modules may be coupled in series in the LED array to provide a voltage drop across the LED array that allows for one power source to provide power to the entire LED array. The one power source may be, for example, an AC power source such that the LED array is operated as an ACLED.

In some embodiments, one or more stacked LED modules 150 and/or LED array 200 are used in a light projector system. For example, stacked LED modules 150 and/or LED array 200 may be used as the optical engine, or as part of the optical engine, in a light projector (source) system similar to light source system 10, depicted in FIG. 1. Using stacked LED modules 150 and/or LED array 200 in the light projector system may reduce the size of the system by combining two different wavelength light sources into a single set of LED modules (e.g., stacked LED modules 150). Combining the two different wavelength light sources and reducing the size of the light projector system may potentially lower the cost for making and operating the light projector system.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor light emitting device, comprising:
   a substrate;
   a first epitaxial structure over the substrate, the first epitaxial structure comprising a first doped layer, a first light emitting layer, and a second doped layer;
   a first electrode coupled to the first doped layer;
   a second electrode coupled to the second doped layer that faces the same direction as the first electrode;
   a second epitaxial structure comprising a third doped layer, a second light emitting layer, and a fourth doped layer;
   a third electrode coupled to the third doped layer that faces the same direction as the first electrode;
   a fourth electrode coupled to the fourth doped layer that faces the same direction as the first electrode;
   an adhesive layer between the first epitaxial structure and the second epitaxial structure and;
   a wavelength-conversion layer positioned over the first epitaxial structure and the second epitaxial structure, wherein the wavelength-conversion layer comprises red and/or orange phosphors that generate converted light responsive to irradiation by the first epitaxial structure and/or the second epitaxial structure, and wherein the first light emitting layer emits green light, the second light emitting layer emits blue light, and the converted light combined with the green light and blue light is substantially white light.

2. The device of claim 1, wherein the first doped layer comprises a first dopant type and the second doped layer comprises a second dopant type, and wherein the third doped layer comprises the first dopant type and the fourth doped layer comprises the second dopant type.

3. The device of claim 1, wherein the first electrode is located at or near a first corner of the semiconductor light emitting device and the second electrode is located at or near a second corner of the semiconductor light emitting device, the first corner being diagonally opposite the second corner.

4. The device of claim 3, wherein the third electrode is located at or near a third corner of the semiconductor light emitting device and the second electrode is located at or near a fourth corner of the semiconductor light emitting device, the third corner being diagonally opposite the fourth corner, and wherein a diagonal line between the third corner and the fourth corner crosses a diagonal line between the first corner and the second corner.

5. The device of claim 1, wherein the first epitaxial structure is biased independently of the second epitaxial structure.

6. The device of claim 1, wherein the first light emitting layer is independently controlled from the second light emitting layer.

7. The device of claim 1, wherein the substrate comprises a patterned substrate.

8. The device of claim 1, wherein a surface of the first epitaxial structure facing the substrate is patterned.

9. A light emitting diode array, comprising:
   two or more light emitting diode modules formed on a substrate, wherein each light emitting diode module comprises:
   a first epitaxial structure over the substrate, the first epitaxial structure comprising a first doped layer, a first light emitting layer, and a second doped layer;
   a first electrode coupled to the first doped layer;
   a second electrode coupled to the second doped layer that faces the same direction as the first electrode;
   a second epitaxial structure comprising a third doped layer, a second light emitting layer, and a fourth doped layer;
   a third electrode coupled to the third doped layer that faces the same direction as the first electrode;
   a fourth electrode coupled to the fourth doped layer that faces the same direction as the first electrode;
   an adhesive layer between the first epitaxial structure and the second epitaxial structure; and
   a wavelength-conversion layer positioned over the first epitaxial structure and the second epitaxial structure, wherein the wavelength-conversion layer comprises red and/or orange phosphors that generate converted light responsive to irradiation by the first epitaxial structure and/or the second epitaxial structure, and wherein the first light emitting layer emits green light, the second light emitting layer emits blue light, and the converted light combined with the green light and blue light is substantially white light;
   wherein one of the first electrode and the second electrode of one light emitting diode module is coupled to one of the first electrode and the second electrode of an adjacent light emitting module; and
   wherein one of the third electrode and the fourth electrode of one light emitting diode module is coupled to one of the third electrode and the fourth electrode of an adjacent light emitting module.

10. The array of claim 9, wherein the first doped layer comprises a first dopant type and the second doped layer comprises a second dopant type, and wherein the third doped layer comprises the first dopant type and the fourth doped layer comprises the second dopant type.

11. The array of claim 9, wherein the first electrode of one light emitting diode module is coupled to the second electrode of an adjacent light emitting module, and the third electrode of one light emitting diode module is coupled to the fourth electrode of an adjacent light emitting module.

12. The array of claim 11, wherein the array is an m×n array with m being an odd number and n being an even number.

13. The array of claim 11, wherein the array is configured such that light emitted from at least one of the first light emitting layers is combined with light emitted from at least one of the second light emitting layers to emit light at a single wavelength during use, and the light emitting diode modules are coupled to a single AC power source.

* * * * *